(12) United States Patent
Kim

(10) Patent No.: US 12,433,107 B2
(45) Date of Patent: Sep. 30, 2025

(54) DISPLAY DEVICE INCLUDING DAM AND CRACK DETECTOR

(71) Applicant: LG Display Co., Ltd., Seoul (KR)

(72) Inventor: Min-Kyu Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/317,579

(22) Filed: May 15, 2023

(65) Prior Publication Data

US 2023/0284495 A1 Sep. 7, 2023

Related U.S. Application Data

(63) Continuation of application No. 17/130,749, filed on Dec. 22, 2020, now Pat. No. 11,690,264.

(30) Foreign Application Priority Data

Dec. 27, 2019 (KR) .......................... 10-2019-0176694

(51) Int. Cl.
*H10K 59/122* (2023.01)
*H10K 50/17* (2023.01)
(Continued)

(52) U.S. Cl.
CPC ......... *H10K 59/122* (2023.02); *H10K 50/171* (2023.02); *H10K 50/844* (2023.02);
(Continued)

(58) Field of Classification Search
CPC ............. H01L 27/3276; H01L 27/3211; H01L 27/3246; H01L 51/5092; H01L 51/5253;
(Continued)

(56) References Cited

U.S. PATENT DOCUMENTS 11,011,728 B2   5/2021   Kwon et al.
2005/0077816 A1  4/2005   Yamada et al.
(Continued)

FOREIGN PATENT DOCUMENTS

| KR | 10-2018-0013225 A | 2/2018 |
| KR | 10-2019-0057749 A | 5/2019 |
| KR | 10-2019-0065757 A | 6/2019 |

OTHER PUBLICATIONS

United States Office Action, U.S. Appl. No. 17/130,749, filed Sep. 15, 2022, 21 pages.
Korean Intellectual Property Office, Office Action, Korean Patent Application No. 10-2019-0176694, Apr. 8, 2025, 21 pages.

*Primary Examiner* — Eric W Jones
(74) *Attorney, Agent, or Firm* — Fenwick & West LLP

(57) ABSTRACT

A display device includes: a substrate having a display area and a non-display area; a lower connection line disposed in the non-display area; a bank layer disposed on the lower connection line and having an undercut structure at an edge of a lower end portion thereof; a bank etch layer disposed between the lower connection line and the bank layer and having an edge inside the edge of the lower end portion of the bank layer; and a second driving electrode disposed on the bank layer and electrically connected to the lower connection line at least once, wherein a plurality of bank holes are formed in the bank layer.

23 Claims, 4 Drawing Sheets

(51) Int. Cl.
 *H10K 50/844* (2023.01)
 *H10K 59/131* (2023.01)
 *H10K 59/35* (2023.01)
(52) U.S. Cl.
 CPC ........... *H10K 59/131* (2023.02); *H10K 59/35* (2023.02); *H10K 50/17* (2023.02); *H10K 59/1315* (2023.02)
(58) Field of Classification Search
 CPC .... H10K 59/131; H10K 59/122; H10K 59/35; H10K 59/1315; H10K 50/171; H10K 50/844; H10K 50/17
 USPC .............................................. 257/40, 59, 99
 See application file for complete search history.

(56) References Cited

U.S. PATENT DOCUMENTS

| | | | |
|---|---|---|---|
| 2014/0103385 A1* | 4/2014 | Hatano | H10K 50/19 438/28 |
| 2014/0306198 A1 | 10/2014 | Im et al. | |
| 2015/0048328 A1 | 2/2015 | Kato et al. | |
| 2016/0268356 A1 | 9/2016 | Go et al. | |
| 2017/0194599 A1 | 7/2017 | Furuie | |
| 2017/0279079 A1 | 9/2017 | Kim et al. | |
| 2018/0097050 A1 | 4/2018 | Yokota et al. | |
| 2018/0138450 A1 | 5/2018 | Park et al. | |
| 2018/0151838 A1 | 5/2018 | Park et al. | |
| 2018/0166525 A1 | 6/2018 | Kim et al. | |
| 2019/0006442 A1* | 1/2019 | Byun | H10K 59/873 |
| 2019/0057632 A1 | 2/2019 | Kim et al. | |
| 2020/0328376 A1* | 10/2020 | Seo | H10K 59/8731 |

* cited by examiner

DISPLAY DEVICE INCLUDING DAM AND CRACK DETECTOR

CROSS REFERENCE TO RELATED APPLICATIONS

This application is a continuation of U.S. patent application Ser. No. 17/130,749 filed on Dec. 22, 2020, which claims the priority benefit of Republic of Korea Patent Application No. 10-2019-0176694 filed in the Republic of Korea on Dec. 27, 2019, each of which is hereby incorporated by reference in its entirety.

BACKGROUND

Technical Field

The present disclosure relates to a display device, and more particularly, to a display device which allows electrode disconnection defects occurring in a non-display area to be reduced.

Discussion of the Related Art

Image display devices, which implement a variety of information on a screen, are the core technologies of the information and communication era. Such image display devices are being developed to be thinner, lighter, and more portable, and furthermore to have high performance. Accordingly, display devices capable of being manufactured in a light and thin form are in the spotlight. Since the display device is a self-luminous device, the display device is not only advantageous in terms of power consumption due to low voltage driving but also has high-speed response speed, high luminous efficiency, a wide viewing angle, and excellent contrast ratio and thus is being researched as a next-generation display. The display device implements an image through a plurality of subpixels arranged in a matrix form. Each of the plurality of subpixels includes a light-emitting element and a plurality of transistors that independently drive the light-emitting element.

Specific examples of the display devices include liquid crystal display (LCD) devices, quantum dot (QD) display devices, field emission display (FED) devices, and organic light-emitting diode (OLED) display devices.

Among the display devices, the OLED display device, which does not require a separate light source and is in the spotlight as a device for compactness and a clear color display, has advantages such as fast response speed, high contrast ratio, high luminous efficiency, high luminance, and wide viewing angle by using OLEDs that self-emit light.

The OLED display device includes organic light-emitting elements that are independently driven for each subpixel, and each organic light-emitting element includes a first driving electrode, a second driving electrode, and a plurality of organic layers, such as a hole injection layer, a hole transport layer, an organic light-emitting layer, and an electron transport layer, between the first driving electrode and the second driving electrode.

Since the organic light-emitting element includes a common layer that is commonly provided to each of the subpixels, in order to prevent a leakage current which flows to a side portion through the common layer, a bank etch layer is additionally provided on an upper end of a positive electrode to induce a portion of the common layer to be disconnected, thereby blocking the leakage current occurring at a side portion between the subpixels.

However, there is a problem in that a second driving electrode is easily disconnected due to the bank etch layer provided for the purpose of disconnecting some of the common layers. Unlike a display area in which several other common layers are present, since a common layer does not present in a non-display area at a peripheral portion, due to the disconnection of the second driving electrode, connection defects may occur with a lower connection line through which a power voltage in a power supply line is supplied to the second driving electrode.

SUMMARY

Accordingly, the present disclosure is directed to a display device that substantially obviate one or more of the problems due to limitations and disadvantages of the related art.

An object of the present disclosure is to provide a display device where a second driving electrode is connected to a lower connection line at least once in a non-display area, and in particular, bank holes are densely formed in the non-display area such that a lower etch rate is applied according to a microscopic loading effect as compared with a display area, thereby reducing defects due to the disconnection of the second driving electrode.

Additional features and advantages of the disclosure will be set forth in the description which follows, and in part will be apparent from the description, or may be learned by practice of the disclosure. These and other advantages of the disclosure will be realized and attained by the structure particularly pointed out in the written description and claims hereof as well as the appended drawings.

To achieve these and other advantages and in accordance with the purpose of the present disclosure, as embodied and broadly described herein, a display device includes: a substrate having a display area and a non-display area; a lower connection line disposed in the non-display area; a bank layer disposed on the lower connection line and having an undercut structure at an edge of a lower end portion thereof; a bank etch layer disposed between the lower connection line and the bank layer and having an edge inside the edge of the lower end portion of the bank layer; and a second driving electrode disposed on the bank layer and electrically connected to the lower connection line at least once, wherein a plurality of bank holes are formed in the bank layer.

In another aspect, a display device includes: a substrate which has a display area including a plurality of subpixels and a non-display area outside the display area; a first driving electrode provided for each of the subpixels; a lower connection line made of the same material as the first driving electrode and disposed in the non-display area; a bank layer disposed on the first driving electrode and the lower connection line and having an undercut structure at an edge thereof adjacent to the lower connection line; a second driving electrode disposed on the bank layer, spaced apart from the first driving electrode, and electrically connected to the lower connection line at least once; and a bank etch layer disposed such that an upper surface thereof is covered by the bank layer, wherein the second driving electrode is in contact with a side portion of the bank layer.

It is to be understood that both the foregoing general description and the following detailed description are explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this disclosure, illustrate embodiments of the disclosure and together with the description serve to explain the principles of the disclosure. In the drawings.

DETAILED DESCRIPTION

Figure 1:
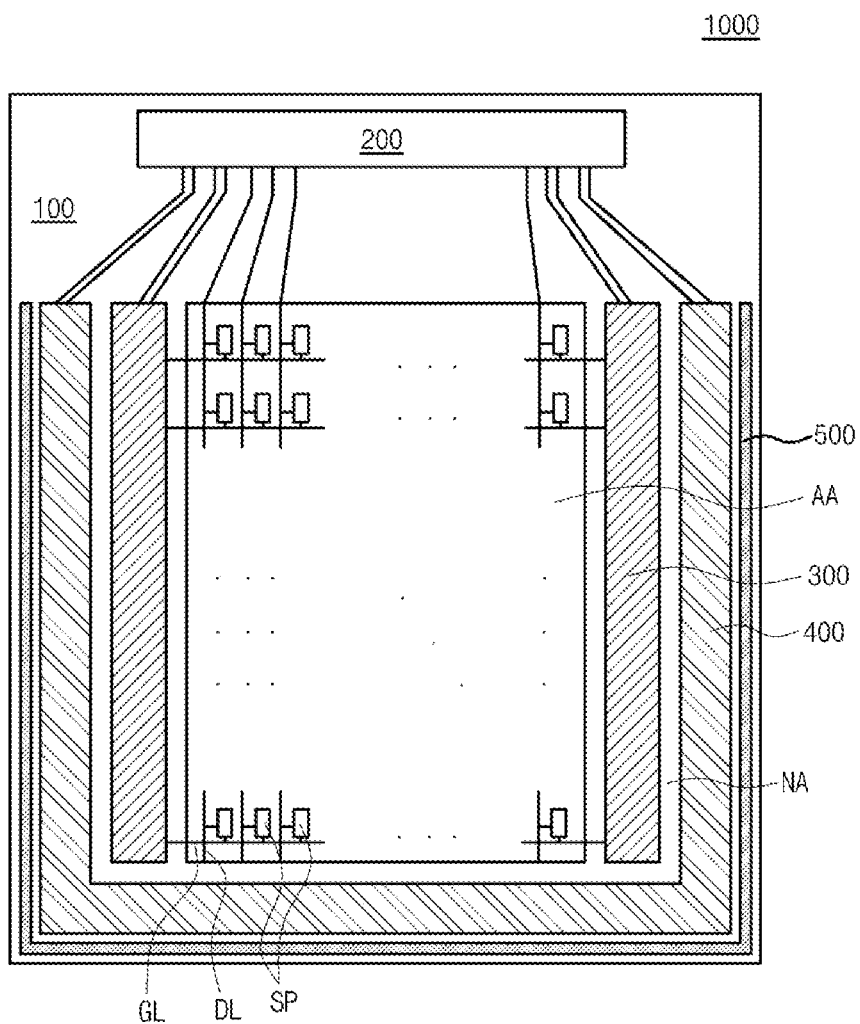
FIG. 1 is a plan view of a display device according to an embodiment of the present disclosure.

The shapes, sizes, ratios, angles, numbers, and the like illustrated in the accompanying drawings for describing the examples of the present disclosure are merely examples, and thus, the present disclosure is not limited to the illustrated details. Like reference numerals generally denote like elements throughout the present disclosure. In describing the examples of the present disclosure, when the detailed description of the relevant known function or configuration is determined to unnecessarily obscure points of the present disclosure, the detailed description will be omitted.

When the terms "comprising," "having," and "including" described in the present disclosure are used, other components may be added unless the terms are used with the term "only." Any references to the singular may include the plural unless expressly stated otherwise.

Components are interpreted to include an ordinary error range even if not expressly stated.

In describing a position relationship, for example, when a position relationship between two parts is described as "on" and "above," one or more other parts may be disposed between the two parts unless the term "directly" is used.

In describing a time relationship, for example, when the temporal order is described as "after," "subsequent to," "next," and "before," a situation which is not continuous may be included unless the term "just" or "directly" is used.

Although the terms "first", "second", and the like are used for describing various components, these components are not confined by these terms. These terms are only used to distinguish one element or component from another element or component. Therefore, a first component to be described below may be a second component in a technical concept of the present disclosure.

The phrase "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various examples of the present disclosure can be partially or overall coupled to or combined with each other and can be variously inter-operated with each other and driven technically. The examples can be performed independently from each other or can be performed together in a co-dependent relationship.

Hereinafter, examples of a display device according to embodiments of the present disclosure will be described in detail with reference to the accompanying drawings. In adding reference numerals for elements in each drawing, it should be noted that like reference numerals already used to denote like elements in other drawings are used for elements wherever possible. Since scales of components shown in the accompanying drawings are different from actual scales for convenience of description, the present disclosure is not limited to the scales shown in the accompanying drawings.

FIG. 1 is a plan view of a display device according to an embodiment of the present disclosure.

Referring to FIG. 1, a display device 1000 may include a substrate 100, a data driver 200, a gate driver 300, a power supply line 400, and a crack prevention part 500.

The substrate 100 may include a display area AA and a non-display area NA surrounding the display area AA. The display area AA may be an area in which an image is actually displayed on the display device 1000, and light-emitting elements and various driving elements for driving the light-emitting elements may be disposed in the display area AA. The non-display area NA may be an area in which an image is not displayed and may be an area surrounding the display area AA. Various components for driving a plurality of pixels disposed in the display area AA may be disposed in the non-display area NA. For example, as shown in FIG. 1, various signal lines such as gate lines GL and data lines DL, the gate driver 300, the power supply line 400, and the like may be disposed in the non-display area NA of the substrate 100.

In the display area AA, a plurality of subpixels SP constituting the plurality of pixels are arranged in a matrix form to display an image. Accordingly, there are a plurality of subpixel lines, and the subpixel lines may be subpixel rows or subpixel columns. Hereinafter, the subpixel rows are described as the subpixel lines. Each of the subpixels SP includes thin film transistors that operate as pixel driving circuits, and the light-emitting element connected to the thin film transistors.

The subpixel SP is formed as a top-emission type, a bottom-emission type, or a dual-emission type according to the structure thereof. The subpixels SP include a red subpixel, a green subpixel, and a blue subpixel or include a white subpixel, a red subpixel, a green subpixel, and a blue subpixel. The subpixels SP may have one or more different emission areas according to the emission characteristics.

A controller (not shown) supplies various control signals to the data driver 200 and the gate driver 300 to control the data driver 200 and the gate driver 300.

The controller starts scanning according to a timing implemented in each frame, converts image data input from an external source into a data signal format used by the data driver 200, outputs the converted image data, and controls data driving at a proper time according to the scanning.

In the display device according to the embodiment of the present disclosure, the controller may be separately formed outside the substrate or may be integrally formed with the data driver 200.

The data driver 200 supplies data voltages to the plurality of data lines DL to drive the plurality of data lines DL. Here, the data driver 200 is also referred to as a source driver.

The gate driver 300 sequentially supplies scan signals to the plurality of gate lines GL to sequentially drive the plurality of gate lines GL. Here, the gate driver 300 is also referred to as a scan driver.

The gate driver 300 sequentially drives the plurality of gate lines GL by sequentially supplying scan signals having an on-voltage or an off-voltage to the plurality of gate lines GL under control of the controller.

The gate driver 300 may be positioned only at one side of the substrate 100 as shown in FIG. 1 or may be positioned at both sides thereof in some cases according to a driving method or a panel design method. In addition, the gate driver 300 may include one or more gate driver integrated circuits (GDICs) or may be implemented as a gate-in panel (GIP) type in the substrate 100 to be formed directly on the substrate 100, but the present disclosure is not limited thereto.

When a specific gate line is enabled, the data driver 200 converts image data received from the controller into data voltage Vdata having an analog form and supplies the converted data voltage to the plurality of data lines DL, thereby driving the plurality of data lines DL.

The data driver 200 may include one or more source driver integrated circuits (SDICs) to drive the plurality of data lines DL.

Each of the above-described GDIC or SDIC may be connected to a bonding pad of the substrate 100 through a tape-automated bonding (TAB) method or a chip-on glass (COG) method, may be disposed directly on the substrate 100, or may be disposed to be integrated into the substrate 100 in some cases.

Each SDIC may include a logic unit including a shift register, a latch circuit, and the like, a digital-analog converter (DAC), an output buffer, and the like. In some cases, a sensing compensator for sensing the characteristics of the subpixel may be provided so as to compensate for the characteristics of the subpixel (for example, a threshold voltage and mobility of a transistor, a threshold voltage of an organic-light emitting diode, and luminance of the subpixel).

In addition, each SDIC may be implemented through a chip-on film (COF) method. In this case, one end of each SDIC is bonded to at least one source printed circuit board, and the other end thereof is bonded to the substrate 100.

Meanwhile, the controller receives various signals, such as a vertical synchronization signal (Vsync), a horizontal synchronization signal (Hsync), an input data enable signal (DE), and a clock signal (CLK), from the external source (for example, a host system) together with input image data.

The controller not only converts the image data input from the external source into a data signal format used in the data driver 200 to output the converted image data, but also receives the various timing signals such as the vertical synchronization signal (Vsync), the horizontal synchronization signal (Hsync), the input data enable signal (DE), and the clock signal and generates and outputs various control signals to the data driver 200 and the gate driver 300.

For example, the controller outputs various gate control signals (GCSs) including a gate start pulse (GSP), a gate shift clock (GSC) signal, a gate output enable (GOE) signal, and the like in order to control the gate driver 300.

Here, the GSP controls an operation start timing of one or more GDICs constituting the gate driver 300. The GSC signal is a clock signal commonly input to one or more GDICs and controls a shift timing of a scan signal (gate pulse). The GOE signal designates timing information of one or more GDICs.

In addition, the controller outputs various data control signals (DCSs) including a source start pulse (SSP), a source sampling clock (SSC) signal, a source output enable (SOE) signal, and the like in order to control the data driver 200.

Here, the SSP controls a data sampling start timing of one or more SDICs constituting the data driver 200. The SSC signal is a clock signal for controlling a data sampling timing of each of the SDICs. The SOE signal controls an output timing of the data driver 200.

The power supply line 400 is a line electrically connected to a second driving electrode 149 (of FIG. 2C) of the light-emitting element to supply power. In this case, the supplied power may be supplied as a common voltage. As shown in FIG. 1, the power supply line 400 is formed outside the display area AA and the gate driver 300 and is disposed to surround the display area AA and the gate driver 300. The power supply line 400 may be made of the same material as a source electrode and a drain electrode of the thin film transistor. However, the present disclosure is not limited thereto, and the power supply line 400 may be made of the same material as a gate electrode of the thin film transistor.

The crack prevention part 500 is formed at an outermost portion of the non-display area NA and is disposed to surround the display area AA and the gate driver 300. The crack prevention part 500 may detect damage to the substrate 100 or the like. The crack prevention part 500 may be made of the same material as the gate electrode of the thin film transistor. However, the present disclosure is not limited thereto, and the crack prevention part 500 may be made of the same material as the source electrode and the drain electrode of the thin film transistor.

Figure 2A:
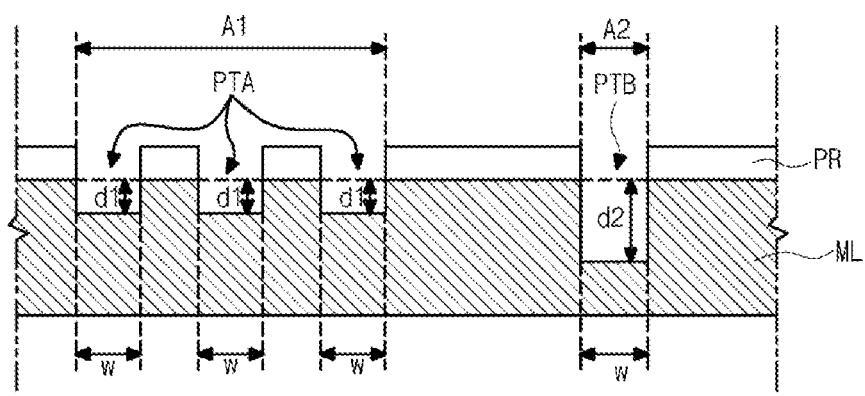
FIGS. 2A and 2B are views for describing the formation of a bank layer of a display device according to an embodiment of the present disclosure.
Figure 2B:
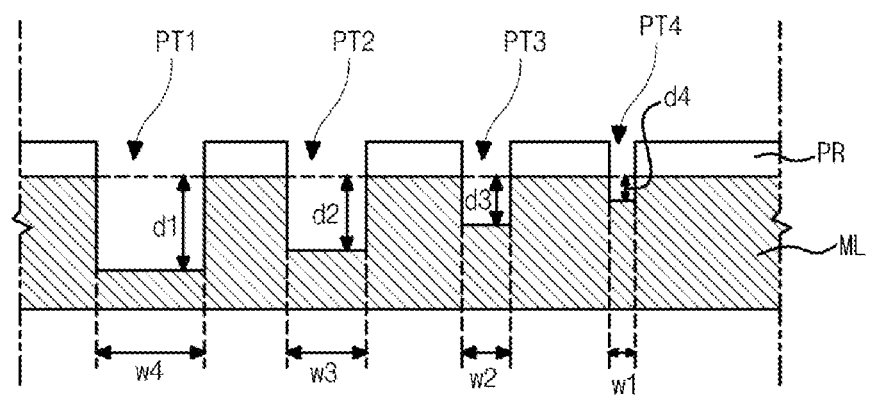

FIGS. 2A and 2B are views for describing the formation of a bank layer of a display device according to an embodiment of the present disclosure.

FIGS. 2A and 2B are views for describing a principle of reducing damage to an active layer due to a conductive pattern on a substrate 100 according to an embodiment of the present disclosure. For example, FIG. 2A is a view for describing a principle due to a microscopic loading effect, and FIG. 2B is a view for describing a principle due to an aspect ratio dependent etch rate (ARDE) effect.

The microscopic loading effect refers to a phenomenon in which an etch rate of an area in which patterns are relatively dense is decreased as compared with an area in which patterns are relatively less dense. For example, when the same etching process is performed, etching may be performed to a lesser depth due to a low etch rate in an area in which patterns are relatively dense, and etching may be performed to a deeper depth due to a high etch rate in an area in which patterns are relatively less dense.

In this regard, referring to FIG. 2A, a bank layer 117 or a bank etch layer 141 (of FIG. 2C) may be etched according to patterns PTA and PTB on which a photoresist PR is applied on a material layer ML. In this case, due to a microscopic loading effect, etch rates of the patterns PTA and PTB may be different according to a degree to which the patterns PTA and PTB are dense.

Specifically, referring to FIG. 2A, as the patterns PTA become denser, an etch rate is decreased, and on the contrary, when the pattern PTB is disposed alone, an etch rate is increased so that a depth d2 of the pattern PTB in a second pattern area A2 in which the pattern PTB is relatively less dense may be greater than a depth d1 of the patterns PTA in a first pattern area A1 in which the patterns PTA are dense.

Next, the ARDE effect refers to a phenomenon in which an etch rate is decreased during etching as an aspect ratio (depth/width) of a pattern is increased. For example, when the same etching process is performed, as a width is increased, an aspect ratio is decreased, and accordingly, an etch rate is increased so that a deeper pattern may be formed.

In this regard, referring to FIG. 2B, a bank layer 117 or a bank etch layer 141 may be etched according to patterns PT1, PT2, PT3, and PT4 on which a photoresist PR is applied. In this case, due to an ARDE effect, etch rates may be different according to aspect ratios of the patterns PT1, PT2, PT3, and PT4.

Specifically, before the patterns PT1, PT2, PT3, and PT4 are etched, the aspect ratios of the patterns PT1, PT2, PT3, and PT4 are zero, and as etching proceeds, the aspect ratios are gradually increased. Therefore, over time, the etch rates of all patterns PT1, PT2, PT3, and PT4 are gradually decreased, but degrees of decreases in the etch rates may be different according to widths thereof.

For example, assuming that a width W4 of a first pattern PT1 is the widest and a width becomes narrower in the order of a second pattern PT2, a third pattern PT3, and a fourth pattern PT4, immediately after an etching process is started, since the aspect ratios of the first pattern PT1 to the fourth pattern PT4 are the same, that is, zero, the etch rates thereof may also be the same. In this case, a time, which is taken until a width W and a depth d are equal to each other such that an aspect ratio becomes one, may be the longest in the first pattern PT1 having the widest width, and may be the shortest in the fourth pattern PT4 having the narrowest width.

Accordingly, the etch rate of the first pattern PT1 of which the aspect ratio is increased most slowly may be relatively decreased most slowly, and the etch rate of the fourth pattern PT4 of which the aspect ratio is increased most rapidly may be decreased most rapidly.

Therefore, as the widths of the patterns PT1, PT2, PT3, and PT4 to be etched are increased, the aspect ratios thereof may be increased slowly, and accordingly, the etch rates thereof may also be decreased slowly. For example, as a width of a pattern is increased, an etched depth may also increase. Accordingly, as shown in FIG. 2B, when etching is performed for the same time, a depth d1 of the first pattern PT1, a depth d2 of the second pattern PT2, a depth d3 of the third pattern PT3, and a depth d4 of the fourth pattern PT4 may be decreased in this order.

Figure 2C:
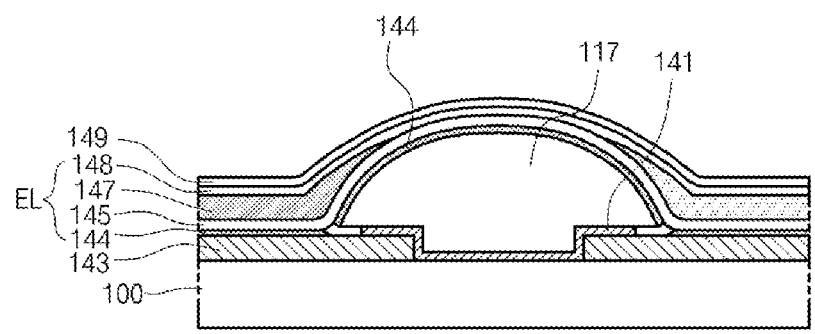
FIG. 2C is a cross-sectional view of a pixel in a display area of a display device according to an embodiment of the present disclosure.

FIG. 2C is a cross-sectional view of a pixel in a display area of a display device according to an embodiment of the present disclosure. For example, FIG. 2C is a cross-sectional view of the pixel designed using a microscopic loading effect in the display area of the display device according to the embodiment of the present disclosure.

Referring to FIG. 2C, a first driving electrode 143 and a bank etch layer 141 having an inorganic insulating film component are sequentially deposited on a substrate 100, and then the bank etch layer 141 and the first driving electrode 143 are selectively removed and divided so as to correspond to an area of each subpixel SP, thereby forming the first driving electrode 143. In such a process, the bank etch layer 141 on the first driving electrode 143 has a width that is the same as or similar to that of the first driving electrode 143.

Next, a bank layer 117 having an organic layer component is applied on the stacked first driving electrode 143 and bank etch layer 141 and then is selectively removed to form the bank layer 117. The bank layer 117 may be made of a material having an etch rate different from an etch rate of the bank etch layer 141. When the bank layer 117 is selectively removed, as compared to the bank layer 117, an etchant having a higher etch rate with respect to the bank etch layer 141 may be used, and in an etching process, according to a microscopic loading effect and an ARDE effect, the bank etch layer 141 formed outside the bank layer 117 is completely removed, and only the bank etch layer 141 formed inside a width of a lower end portion of the bank layer 117 remains. Subsequently, the bank layer 117 is cured by sintering the bank layer 117.

A width of a bank open portion 1170 (of FIG. 3) in which the bank layer 117 is not formed in a display area AA may vary according to the element characteristics of each subpixel SP and the efficiency for each color. For example, since a blue subpixel SP has low efficiency, a width of the bank open portion 1170 in the blue subpixel SP may be the largest amongst the subpixels, and a width of the bank open portion 1170 in a green subpixel SP or a red subpixel SP having high efficiency may be smaller than the width of the bank open portion 1170 in the blue subpixel SP.

In the display device according to the embodiment of the present disclosure, since the bank layer 117 is formed due to a difference in etch rate between the bank layer 117 and the bank etch layer 141, the bank etch layer 141 may be formed without adding a separate mask process.

Figure 2D:
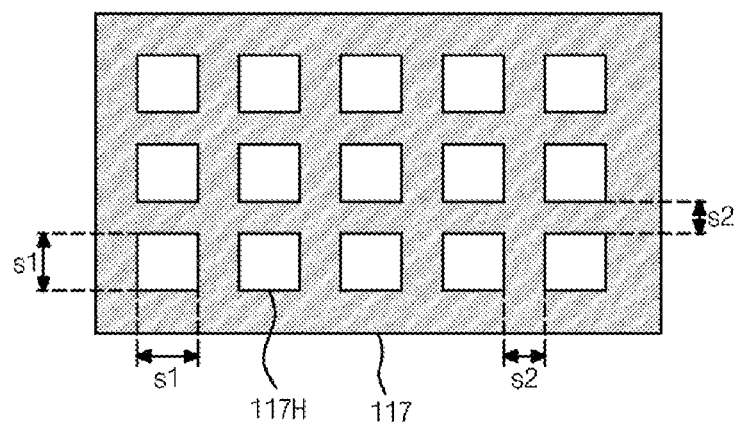
FIG. 2D is a plan view of a non-display area of a display device according to an embodiment of the present disclosure.

FIG. 2D is a plan view of a non-display area of a display device according to an embodiment of the present disclosure. For example, FIG. 2D is a plan view of a bank layer 117 and a bank hole 117H formed using a microscopic loading effect in the non-display area of the display device according to the embodiment of the present disclosure.

A plurality of patterned bank holes 117H may be formed by applying a photoresist PR to a non-display area NA. The plurality of bank holes 117H formed in the non-display area NA may be formed more densely as compared with a bank open portion 1170 in which a bank layer 117 is not formed in a display area AA. Heights s1 and widths s1 of the bank holes 117H are the same, and the bank hole 117H may be formed to be ⅓ to ⅕ of a size of the bank open portion 1170 in which the bank layer 117 is not formed in the display area AA. In addition, an interval s2 between the plurality of bank holes 117H may also be formed to be ⅓ to ⅕ smaller as compared with an interval between the bank layer 117 of the display area AA.

Since the width of the plurality of bank holes 117H and the interval between the bank holes 117H are formed to be smaller as compared with the display area AA, according to a microscopic loading effect and an ARDE effect, a bank etch layer 141 under the bank layer 117 may be etched less as compared with the display area AA. Accordingly, unlike in the display area AA, the bank etch layer 141 of the non-display area NA may be formed to have a width smaller than a width of a lower end portion of the bank layer 117, but a portion of the bank etch layer 141 formed inside the width of the lower end portion of the bank layer 117 may be smaller than the width of the lower end portion of the bank layer 117. For example, the bank etch layer 141 in the non-display area NA may also be formed such that the bank layer 117 has an undercut structure.

In the present disclosure, the bank hole 117H is illustrated as having a rectangular shape for description, but the present disclosure is not limited thereto. For example, the bank hole 117H may be formed in a circular or polygonal shape.

Figure 3:
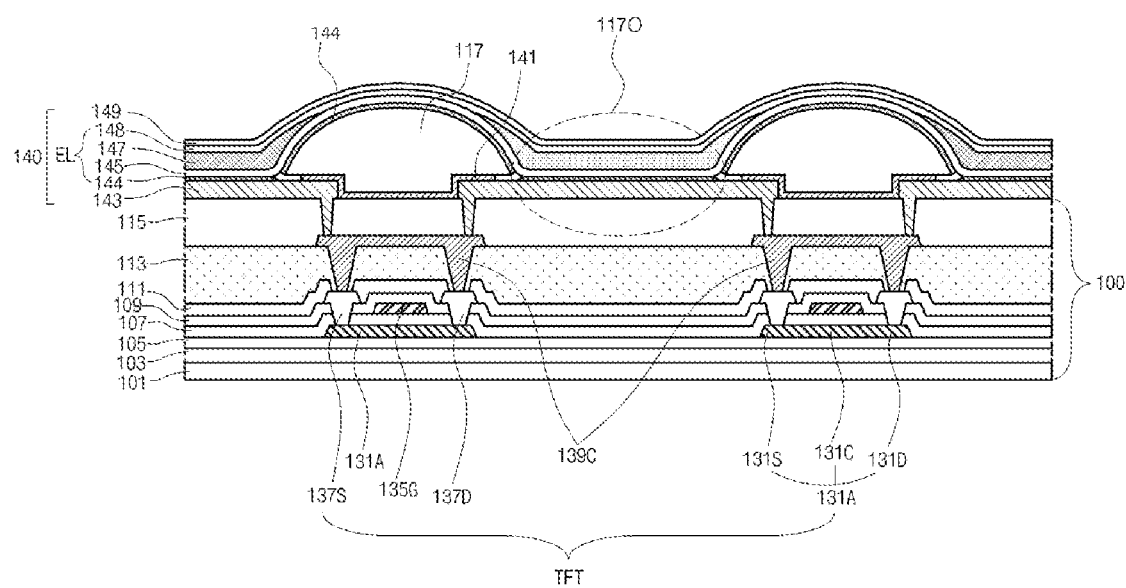
FIG. 3 is a cross-sectional view illustrating a display area in a display device according to an embodiment of the present disclosure.

FIG. 3 illustrates a cross-sectional view of a display area in a display device according to an embodiment of the present disclosure and illustrates a boundary between adjacent subpixels.

Referring to FIG. 3, the display device may include a substrate 100 including a plurality of subpixels SP, a bank layer 117 which is positioned at a boundary between the subpixels SP and exposes an emission part of each subpixel SP, a first driving electrode 143 provided for each subpixel SP, a bank etch layer 141 which is positioned between the bank layer 117 and the first driving electrode 143 to allow a lower end portion of the bank layer 117 adjacent to the emission part to be vertically spaced apart from an upper portion of the first driving electrode 143, a hole injection layer 144 which is positioned on a surface of the bank layer 117 and in the emission part and is divided at the lower end portion of the bank layer 117, and one or more common layers 145, 148, and 149 formed on the hole injection layer 144.

Here, the "common layer" may be formed, without division, in the plurality of subpixels SP in a display area AA at least. Each common layer is formed in the entire display area AA and has an extension portion that extends outward from the display area AA to partially overlap a non-display area NA. In addition, the hole injection layer 144 disposed at the lower end portion of the bank layer also has an extension portion that extends outward from the display area AA to partially overlap the non-display area NA.

In addition to a hole transport layer 145 and an electron transport layer 148, a second driving electrode 149 may also be included in the common layers as a counter electrode with respect to the first driving electrode 143.

In addition to the above-described layers, as common layers, a hole control layer may be further provided between the hole transport layer 145 and a light-emitting layer 147, and an electron control layer may be further provided between the light-emitting layer 147 and the electron transport layer 148.

In the bank layer 117 described in the present disclosure, an area in which the light-emitting layer 147 emits light, for example, a part in which a pattern provided to define the emission part is not formed, may be the emission part. The bank layer 117 may be made of a material having an etch rate different from that of the bank etch layer 141 of the present disclosure, for example, may be made of an organic material such as polyimide, but the present disclosure is not limited thereto. In addition, for example, the bank etch layer 141 may be made of an inorganic material or other insulating materials having an etch rate different from that of the bank layer 117.

The light-emitting layer 147 is provided to correspond to the emission part of each subpixel SP at least. The light-emitting layer 147 may be formed by depositing a light-emitting material of a color corresponding to a predetermined color of light emitted from each subpixel SP using a fine metal mask (FMM) having an opening. The light-emitting layer 147 may be provided separately for each subpixel SP between the hole transport layer 145 and the electron transport layer 148. Unlike the common layers, such as the hole transport layer 145, the electron transport layer 148, and the second driving electrode 149, being formed using a common mask having an opening greater than the display area AA, since the light-emitting layer 147 is formed in the emission part of a certain subpixel SP using the FMM having a fine opening, an area for each subpixel SP may be distinguished.

As another example, the structure of the light-emitting layer 147 may be formed as a structure in which a plurality of light-emitting layers 147 are stacked. The plurality of light-emitting layers 147 may be stacked to emit white light, or the plurality of light-emitting layers 147 having the same color as light emitted from the corresponding subpixel SP may be stacked. For an optimal combination between holes and electrons, a charge generation layer or transport layers may be further provided between the light-emitting layers 147 in the stacked structure of the plurality of light-emitting layers 147.

More specifically, on the first driving electrode 143, at least one light-emitting layer 147 may include a hole transport layer, a hole injection layer, a hole blocking layer, an organic emission layer, an electron injection layer, an electron blocking layer, an electron transport layer, and the like which may be sequentially or reversely stacked according to an emission direction thereof. In addition, the light-emitting layer 147 may include first and second emission stacks opposite to each other with the charge generation layer interposed therebetween. In this case, an organic emission layer of one of the first and second emission stacks generates blue light, and an organic emission layer of the other of the first and second emission stacks generates yellow-green light, thereby generating white light through the first and second emission stacks. Since the white light generated by the emission stacks is incident on a color filter positioned on or below the light-emitting layer 147, a color image can be implemented. As another example, each light-emitting layer 147 may generate color light corresponding to each subpixel SP without a separate color filter, thereby implementing a color image. For example, the light-emitting layer 147 of the subpixel SP having a red color (R) may generate red light, the light-emitting layer 147 of the subpixel SP having a green color (G) may generate green light, and the light-emitting layer 147 of the subpixel SP having a blue color (B) may generate blue light.

The hole injection layer 144 may include a p-type dopant in an amount of 5 wt % or less in a hole transport material and thus may be a p-type layer. The hole injection layer 144 may function to facilitate a hole injection. For example, when a current is applied between the first driving electrode 143 and the second driving electrode 149, and when holes flow from the first driving electrode 143, interface resistance may be reduced at an interface at which the first driving electrode 143 meets the hole injection layer 144 that is an organic layer, thereby facilitating hole injection.

Since the hole injection layer 144 includes the p-type dopant having high conductivity, when the hole injection layer 144 is formed in the subpixels SP in a shape of a common layer without division, the hole injection layer 144 may cause a leakage current in a lateral direction. Accordingly, in a display device 1000 of the present disclosure, like the common layers, the hole injection layer 144 may be formed using a common mask, and a structure formed thereunder may be changed, and thus, the hole injection layer 144 may be implemented so that the subpixels SP are separated and isolated from each other.

The bank etch layer 141 may allow the hole injection layer 144 to be separated for each subpixel SP and may be formed under the bank layer 117. The bank etch layer 141 is made of a material having etch selectivity different from that of the bank layer 117. Here, the bank layer 117 may be made of an organic insulating material such as benzocyclobutene (BCB), an acrylic-based resin, or an imide-based resin, and the bank etch layer 141 may be formed as an inorganic film. The bank etch layer 141 may include, for example, at least one selected from among silicon nitride (SiNx), silicon oxide (SiOx), and silicon oxynitride (SiOxNy) and may be formed as a single layer made of the material, a multi-layer made of the same material, or a multi-layer made of different materials. As another example, the bank etch layer 141 and the bank layer 117 may be made of organic materials having different etch selectivities.

Since the bank etch layer 141 is a layer that has no electrical or optical function and no function for area separation of the hole injection layer 144 initially deposited after the bank layer 117 is formed, the bank etch layer 141 should be deposited thinly. In addition, since the bank etch layer 141 should be formed to have a width smaller than a width of the bank layer 117, it may be advantageous for the bank etch layer 141 to be formed as an inorganic insulating film which is easy to form relatively thinly and which has etch selectivity different from that of an organic film.

The bank etch layer 141 is formed to have a width smaller than a width of the lower end portion of the bank layer 117 and has an edge thereof at a point spaced inward from an edge of the lower end portion of the bank layer 117. Accordingly, since the edges of the bank layer 117 and the bank etch layer 141 are formed at different positions, the bank layer 117 may be vertically spaced apart from the first driving electrode 143 at a portion of the lower end portion of the bank layer 117 which protrudes relatively further than the bank etch layer 141. Since the bank etch layer 141 disposed under the bank layer 117 is etched more than the bank layer 117, the lower end portion of the bank layer 117 being exposed is referred to as "undercut."

When a p-type layer-forming material is deposited in a state in which the bank etch layer 141 having the width different from that of the bank layer 117 is provided under the bank layer 117, the hole injection layer 144 is separated in a vertical separation region between the bank layer 117 and the first driving electrode 143.

A light-emitting element 140, which includes the first driving electrode 143, the hole injection layer 144, the hole transport layer 145, the light-emitting layer 147, the electron transport layer 148 (144, 145, 147, 148 constitute an electroluminescent layer EL), and the second driving electrode 149 sequentially deposited in a vertical direction, is provided in each subpixel SP.

In the display device according to the embodiment of the present disclosure, the reason for separating the hole injection layer 144 between areas of the subpixels SP is because the hole injection layer 144 includes the p-type dopant having high conductivity and is disposed just adjacent to the first driving electrode 143. The hole injection layer 144 is disposed so as to be connected without being disconnected in each of the subpixels SP like other common layers, and due to the high conductivity of the hole injection layer 144, a side leakage current may occur between adjacent first driving electrodes 143. In order to reduce the side leakage current, the hole injection layer 144 disposed on an upper surface of the bank layer 117 vertically spaced apart from the first driving electrode 143 and the hole injection layer 144 disposed on the first driving electrode 143 may be separated from each other at the lower end portion of the bank layer 117.

The hole transport layer 145 formed subsequently to the hole injection layer 144 may be continuously formed in areas of the subpixel SP without division. Since the hole transport layer 145 is made of only pure hole transport material relatively as compared with the hole injection layer 144 and has very low conductivity as compared with the hole injection layer 144, even when the hole transport layer 145 is formed with planar continuity, the hole transport layer 145 does not cause a problem in that a current flows to the side. In addition, the hole injection layer 144 is formed thinly to have a thickness of about 500 Å or less, for example, 100 Å or less, and the bank etch layer 141 may be formed to have a thickness that is greater than or equal to the thickness of the hole injection layer 144. For example, when the thickness of the bank etch layer 141 is approximately one to four times the thickness of the hole injection layer 144, since a vertical separation distance between the bank layer 117 and the upper portion of the first driving electrode 143 may be greater than the thickness of the hole injection layer 144, even when the hole injection layer 144 is stacked on the first driving electrode 143 when being deposited, the hole injection layer 144 may not be in contact with the hole injection layer 144 on the bank layer 117.

The light-emitting element 140 is connected to a thin film transistor TFT positioned at a lower side of the substrate 100. The substrate 100 including the thin film transistor TFT and a plurality of thin film transistors required for driving the light-emitting element 140 is also referred to as an array substrate.

The thin film transistor TFT includes a semiconductor layer 131A positioned at a predetermined portion on a base layer 101, a second insulating layer 107 covering the semiconductor layer 131A, a gate electrode 135G provided to overlap the semiconductor layer 131A, and a source electrode 137S and a drain electrode 137D which are connected to both sides of the semiconductor layer 131A.

The semiconductor layer 131A may be made of, for example, amorphous silicon, polysilicon, or an oxide semiconductor, and may be formed by stacking different types of semiconductor layers.

A third insulating layer 109 may be formed between the gate electrode 135G and the source and drain electrodes 137S and 137D excluding connection portions between the semiconductor layer 131A and the source and drain electrodes 137S and 137D.

A protective layer 111, a first intermediate layer 113, and a second intermediate layer 115 may be formed to cover the thin film transistor TFT. The first intermediate layer 113, the second intermediate layer 115, and the protective layer 111 may be selectively removed to form contact holes which expose predetermined portions of the source electrode 137S and the drain electrode 137D to be connected to the first driving electrode 143 of the light-emitting element 140.

Figure 4:
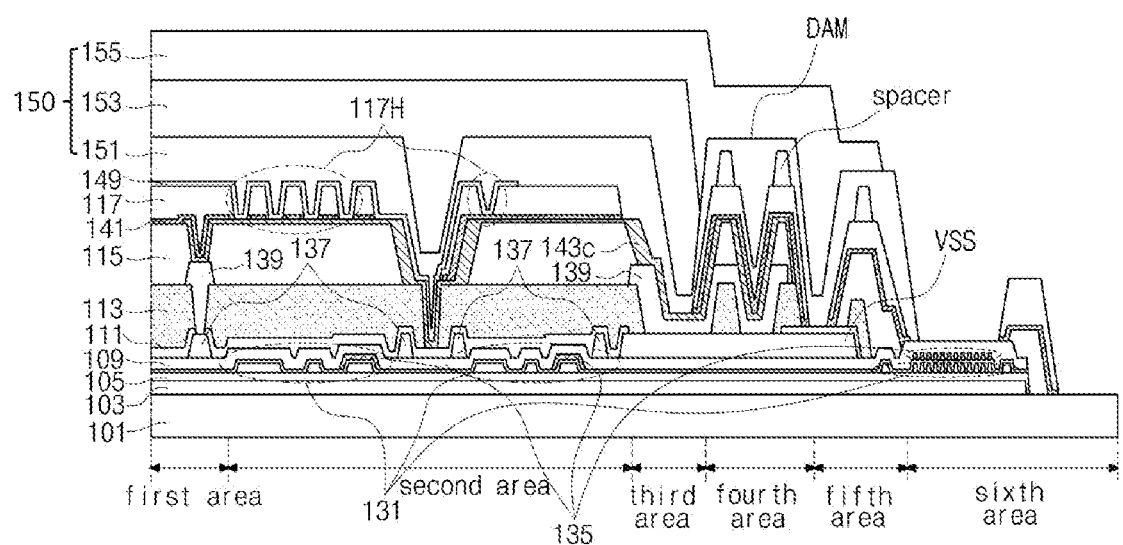
FIG. 4 is a cross-sectional view illustrating a non-display area of the display device according to an embodiment of the present disclosure.

FIG. 4 is a cross-sectional view of a non-display area at a peripheral portion of the display device according to an embodiment of the present disclosure.

Referring to FIG. 4, FIG. 4 illustrates a cross section across a gate driver 300 outside the display area AA. Due to a structure including the bank etch layer 141 which is provided at a lower end portion of the bank layer 117 even in the non-display area NA so as to protrude inward from an edge of the lower end portion of the bank layer 117, the display device according to the embodiment of the present disclosure may be considered to protect a short circuit of an upper electrode, for example, the second driving electrode 149.

The non-display area NA at a peripheral portion of the substrate 100 may be classified according to functions. For example, a first area may be in contact with the display area AA to transmit various signals, voltages, and the like applied from the gate driver 300 to the display area AA. The gate driver 300 may be formed in a second area. A third area may be an area designed such that a second encapsulation layer 153 does not cross over a dam DAM. The dam DAM and a power supply line 400 may be formed in a fourth area. Ends of first and third encapsulation layers 151 and 155 may be formed in a fifth area. A crack prevention part 500 may be formed in a sixth area.

Edges of the bank etch layer 141 and the second driving electrode 149 may be disposed in the second area of the non-display area NA in which the gate driver 300 is formed. The second driving electrode 149 may be disposed to extend to the second area and is formed so as not to be disconnected in a bank hole 117H.

The bank etch layer 141 formed to reduce a leakage current between pixels in the display area AA and the second driving electrode 149 formed as a common layer may each be formed by depositing a corresponding organic material using a common mask which opens the entirety of the display area AA and a portion of the non-display area NA. In the non-display area NA, the second driving electrode 149, which is connected to a lower connection line 143c made of the same material as the first driving electrode 143 to receive a ground voltage or a driving voltage, is formed to protrude to the gate driver 300 at a peripheral portion of the non-display area NA, and the bank etch layer 141 is formed up to an outermost area of the non-display area NA including the gate driver 300 and the dam DAM.

The bank etch layer 141 is formed by being deposited over an entire area of the substrate 100, and the second driving electrode 149 is deposited on the bank layer 117 formed in an undercut due to the bank etch layer 141. The bank layer 117 may be patterned through a photo process such that the second driving electrode 149 is connected to the lower connection line 143c made of the same material as the first driving electrode 143. The bank etch layer 141 may protect the lower connection line 143c from being damaged.

Since the bank etch layer 141 is formed, the disconnection of the hole injection layer 144 is induced to reduce driving due to a leakage current between adjacent subpixels in the display area AA, but since the plurality of common layers or the light-emitting layer 147 are not formed in the non-display area NA, the non-display area NA may become a structure that is disadvantageous for the disconnection of the second driving electrode 149 as compared with the display area AA.

Accordingly, in the second area of the non-display area NA, one or more bank holes 117H are formed in the bank layer 117 and the bank etch layer 141 to connect the lower connection line 143c at least once or to contact the lower connection line 143c in at least one location and the second driving electrode 149, thereby preventing a driving failure due to a short circuit of the second driving electrode 149 formed on the bank layer 117.

In addition, in the second area of the non-display area NA, in order to constitute the gate driver 300, a plurality of gate metal patterns 131 and 135 may be patterned coplanar with a gate line GL so as to be spaced apart from each other, and a plurality of first source/drain metal patterns 137 may be patterned coplanar with a data line DL so as to be spaced apart from each other.

The bank hole 117H may be formed so as to avoid the disconnection of the second driving electrode 149 by using a microscopic loading effect. To this end, the bank hole 117H in the non-display area NA may be formed to be about ⅓ to ⅕ smaller than the bank hole 117H in the display area AA.

Since the second driving electrode 149 is connected to the lower connection line 143c disposed coplanar with the first driving electrode 143 of the display area AA several times through the bank holes 117H, the electrical stability of the second driving electrode 149 may be further enhanced, and a portion of the lower connection line 143C may be connected to first and second source/drain metal patterns 137 and 139 disposed thereunder to apply a ground voltage or a driving voltage.

In the fourth area of the non-display area NA, a power supply line VSS may be formed at an end portion of the non-display area NA to be coplanar with the first source/drain metal pattern 137, the second source/drain metal pattern 139 may be disposed to be connected to the power supply line VSS through a contact hole formed in the first intermediate layer 113, and the lower connection line 143c formed on the second intermediate layer 115 may be connected thereto to apply a ground voltage or a driving voltage to the second driving electrode 149. The power supply line VSS may be formed not only in the fourth area of the non-display area NA but also in the third area.

In the display device according to the embodiment of the present disclosure, since the bank etch layer 141 is provided to protrude inward toward the lower end portion of the bank layer 117 in the non-display area NA, in order to reduce a short circuit of the second driving electrode 149 among layers formed at an upper side of the bank layer 117, one or more bank holes 117H may be formed in the non-display area NA at least to allow the second driving electrode 149 to be in stable contact with the lower connection line 143c. In addition, the second driving electrode 149 may be electrically connected to the power supply line VSS, which is provided coplanar therewith, through the lower connection line 143c.

In addition, in the sixth area of the non-display area NA, the crack prevention part or the crack detector 500 may be formed using first and second gate metal patterns 131 and 135. The damage to the substrate 100 may be detected through a crack detection signal in the first and second gate metal patterns 131 and 135 disposed in the sixth area of the non-display area NA.

Referring to FIGS. 3 and 4, a pixel driving circuit and the light-emitting element 140 are not disposed in the non-display area NA, but the base layer 101 and the organic/inorganic layers 103, 105, 107, 109, 111, and 115 may be present. In addition, materials used to constitute the display area AA may be disposed in the non-display area NA for other purposes. For example, the second gate metal pattern 135 made of the same metal as the gate electrode 135G of the thin film transistor TFT in the display area AA, or the first source/drain metal patterns 137 made of the same material as the source electrode 137S and the drain electrode 137D in the display area AA may be disposed in the non-display area NA for lines or electrodes. Furthermore, the second source/drain metal pattern 139 may be disposed in the non-display area NA for lines or electrodes. The metal patterns may be disposed on different layers and may be insulated from each other through the plurality of layers 103, 105, 107, 109, 111, 113, and 115. For example, the source electrode 137S and the drain electrode 137D may be used as the power supply line 400. The power supply line 400 may be connected to the second source/drain metal pattern 139, and the first driving electrode 143 of the light-emitting element 140 may be connected to the source electrode 137S, the drain electrode 137D, and the second source/drain metal pattern 139 to receive power. The second source/drain metal pattern 139 may be in contact with the power supply line 400 and may extend along an outermost sidewall of the second intermediate layer 115 to meet or be in contact with the first driving electrode 143 on the second intermediate layer 115.

The base layer 101 may be made of a plastic material having flexibility. When the base layer 101 is made of the plastic material, for example, the base layer 101 may be made of polyimide (PI), but the present disclosure is not limited thereto. When the base layer 101 is made of PI, in a state in which a support substrate made of glass is disposed under the base layer 101, a manufacturing process of the display device 1000 is performed, and after the manufacturing process of the display device 1000 is completed, the support substrate may be released. In addition, after the support substrate is released, a back plate for supporting the base layer 101 may be disposed under the base layer 101.

However, the present disclosure is not limited thereto, and in some cases, the support substrate made of glass may be used without change.

A buffer layer 103 having a single-layered or multi-layered structure may be disposed on the base layer 101. The buffer layer 103 disposed on the base layer 101 may be formed as a single-layer of silicon nitride (SiNx) or silicon oxide (SiOx) or as a multi-layer in which a silicon nitride (SiNx) layer and a silicon oxide (SiOx) layer are alternately formed.

The buffer layer 103 may improve adhesive strength between the base layer 101 and layers formed on the buffer layer 103 and may protect the thin film transistor TFT from impurities such as alkali ions leaking from the base layer 101 or layers thereunder. The buffer layer 103 may be formed of silicon oxide (SiOx), silicon nitride (SiNx), or a multi-layer thereof, but the present disclosure is not limited thereto. The buffer layer 103 may include a multi-buffer and/or an active buffer. In addition, the buffer layer 103 may be omitted based on the type and material of the base layer 101 and the structure and type of the thin film transistor TFT.

In the display area AA of the base layer 101, the thin film transistor TFT for driving the light-emitting element 140 may be disposed on the buffer layer 103. A first insulating layer 105 may be further disposed between the thin film transistor TFT and the buffer layer 103 to form the thin film transistor TFT more stably.

The thin film transistor TFT may include the semiconductor layer 131A, the gate electrode 135G, the source electrode 137S, and the drain electrode 137D. Here, according to a design of a pixel circuit, the source electrode 137S may be a drain electrode, and the drain electrode 137D may be a source electrode. In the display area AA of the base layer 101, the semiconductor layer 131A of the thin film transistor TFT may be disposed on the first insulating layer 105.

The semiconductor layer 131A may include low temperature poly-silicon (LTPS). Since a polysilicon material has high mobility (of 100 cm2/Vs or more), low energy consumption, and excellent reliability, the polysilicon material may be applied to gate drivers and/or multiplexers (MUX) for a driving element, which drives thin film transistors for a display element. In addition, in the display device 1000 according to the embodiment of the present disclosure, the polysilicon material may be applied to the semiconductor layer 131A of a driving thin film transistor, but the present disclosure is not limited thereto. For example, the polysilicon material may be applied to a semiconductor layer of a switching thin film transistor according to the characteristics of the display device 1000. Polysilicon may be formed through a method of depositing an amorphous silicon (a-Si) material on the first insulating layer 105 and performing a dehydrogenation process and a crystallization process, and the polysilicon may be patterned to form the semiconductor layer 131A.

The semiconductor layer 131A may include a channel region 131C in which a channel is formed when the thin film transistor TFT is driven, and a source region 131S and a drain region 131D at both sides of the channel region 131C. The source region 131S may be a portion of the semiconductor layer 131A connected to the source electrode 137S, and the drain region 131D may be a portion of the semiconductor layer 131A connected to the drain electrode 137D. The source region 131S and the drain region 131D may be formed of the semiconductor layer 131A doped with ions, for example, impurities. The source region 131S and the drain region 131D may be formed of a polysilicon material doped with ions, and the channel region 131C may be a portion remaining as a polysilicon material without being doped with ions.

The semiconductor layer 131A may be made of an oxide semiconductor. Since an oxide semiconductor material is a material having a band gap greater than that of a silicon material, electrons may not cross over the band gap in an off-state, and accordingly, an off-current may be low. Accordingly, a thin film transistor including a semiconductor layer made of an oxide semiconductor may be suitable for a switching thin film transistor that has a short on-time and a long off-time, but the present disclosure is not limited thereto. The thin film transistor including the semiconductor layer made of the oxide semiconductor may be applied as a driving thin film transistor according to the characteristics of the display device 1000. Since the off-current may be low, a magnitude of auxiliary capacitance may be reduced, and thus, the thin film transistor including the semiconductor layer made of the oxide semiconductor may be suitable for a high-resolution display element. For example, the semiconductor layer 131A may be made of a metal oxide and may be made of, for example, various metal oxides such as indium-gallium-zinc-oxide (IGZO). It has been described that the semiconductor layer 131A of the thin film transistor TFT is formed on the basis of an IGZO layer assuming that the semiconductor layer 131A is made of IGZO among various metal oxides. However, the present disclosure is not limited thereto, and the semiconductor layer 131A may be made of other metal oxides such as indium-zinc-oxide (IZO), indium-gallium-tin-oxide (IZTO), and indium-gallium-oxide (IGO) rather than IGZO. The semiconductor layer 131A may be formed by depositing a metal oxide on the first insulating layer 105, performing a heat treatment process for stabilization, and then patterning the metal oxide.

The semiconductor layer 131A may be formed as a first gate metal pattern 131 in the non-display area NA. The first gate metal pattern 131 may be a part of a driving element of the gate driver 300 disposed on the first insulating layer 105, may be disposed coplanar with the semiconductor layer 131A of the thin film transistor TFT, and may be made of the same material as the semiconductor layer 131A, but the present disclosure is not limited thereto.

The second insulating layer 107 covering an upper surface of the semiconductor layer 131A of the thin film transistor TFT may be disposed on the first insulating layer 105. The second insulating layer 107 may be formed as a single-layer of silicon nitride (SiNx) or silicon oxide (SiOx) or as a multi-layer of silicon nitride (SiNx) and silicon oxide (SiOx). Contact holes may be formed in the second insulating layer 107 to connect the source electrode 137S and the drain electrode 137D of the thin film transistor TFT to the source region 131S and the drain region 131D of the semiconductor layer 131A of the thin film transistor TFT, respectively.

In the display area AA, the second insulating layer 107 may be disposed on the semiconductor layer 131A. In the non-display area NA, the second insulating layer 107 may be disposed on the first insulating layer 105. As shown in FIGS. 3 and 4, the second insulating layer 107 may be formed on an entire surface of the substrate. However, the present disclosure is not limited thereto. For example, the second insulating layer 107 may be patterned to have the same width as the gate electrode 135G.

In the display area AA of the base layer 101, the gate electrode 135G, and the gate line GL, a storage capacitor (not shown) and the like connected to the gate electrode 135G of the thin film transistor TFT may be disposed on the second insulating layer 107. The gate electrode 135G and the gate line GL may be formed as a single-layer or a multi-layer made of one selected from among molybdenum (Mo), copper (Cu), titanium (Ti), aluminum (Al), chromium (Cr), gold (Au), nickel (Ni), or neodymium (Nd), or an alloy thereof. The gate electrode 135G may be formed on the second insulating layer 107 to overlap the channel region 131C of the semiconductor layer 131A of the thin film transistor TFT.

The gate electrode 135G may be formed as the second gate metal pattern 135 in the non-display area NA. The second gate metal pattern 135 may be a part of a driving element of the gate driver 300 disposed on the second insulating layer 107, may be disposed coplanar with the gate electrode 135G of the thin film transistor TFT, and may be made of the same material as the gate electrode 135G.

The third insulating layer 109 may be disposed on the second insulating layer 107 to cover the gate electrode 135G and the gate line GL of the display area AA and the second gate metal pattern 135 of the non-display area NA. The third insulating layer 109 may be formed as a single-layer of silicon nitride (SiNx) or silicon oxide (SiOx) or as a multi-layer of silicon nitride (SiNx) and silicon oxide (SiOx). Contact holes may be formed in the third insulating layer 109 to expose the source region 131S and the drain region 131D of the semiconductor layer 131A of the thin film transistor TFT. As shown in FIGS. 3 and 4, the third insulating layer 109 may be formed on the entire surface of the substrate, but the present disclosure is not limited thereto. For example, the third insulating layer 109 may be patterned to have the same width as the semiconductor layer 131A.

In the display area AA of the base layer 101, the source electrode 137S and the drain electrode 137D of the thin film transistor TFT may be disposed on the third insulating layer 109. The source electrode 137S and the drain electrode 137D of the thin film transistor TFT may be connected to the semiconductor layer 131A of the thin film transistor TFT through the contact holes formed in the second insulating layer 107 and the third insulating layer 109. Accordingly, the source electrode 137S of the thin film transistor TFT may be connected to the source region 131S of the semiconductor layer 131A through the contact hole formed in the second insulating layer 107 and the third insulating layer 109. The drain electrode 137D of the thin film transistor TFT may be connected to the drain region 131D of the semiconductor layer 131A through the contact hole formed in the second insulating layer 107 and the third insulating layer 109. The source electrode 137S and the drain electrode 137D may be made of one selected from among molybdenum (Mo), copper (Cu), titanium (Ti), aluminum (Al), chromium (Cr), gold (Au), nickel (Ni), and neodymium (Nd), or an alloy thereof and may be formed as a single-layer or a multi-layer. For example, the source electrode 137S and the drain electrode 137D may have a three-layered structure of titanium (Ti)/aluminum (Al)/titanium (Ti) made of conductive metal materials. The materials of the source electrode 137S and the drain electrode 137D are not limited to the described materials. For convenience of description, FIG. 3 illustrates only the driving thin film transistor among various thin film transistors that may be included in the display device 1000, but other thin film transistors such as a switching thin film transistor may also be included in the display device 1000. In addition, although it has been described herein that the thin film transistor TFT has a coplanar structure, the thin film transistor may be implemented in other structures such as a staggered structure.

In the non-display area NA of the base layer 101, the first source/drain metal pattern 137 functioning as a part of a driving element of the gate driver 300 may be disposed on the third insulating layer 109. The first source/drain metal pattern 137 may be disposed coplanar with the source electrode 137S and the drain electrode 137D of the thin film transistor TFT and may be made of the same material as the source electrode 137S and the drain electrode 137D. As shown in FIGS. 3 and 4, the gate driver 300 may include various components such as the first gate metal pattern 131, the second gate metal pattern 135, and the first source/drain metal pattern 137. The first source/drain metal pattern 137 may be electrically connected to the power supply line 400 and the first driving electrode 143 to supply power to the first driving electrode 143.

In the display area AA and the non-display area NA, the protective layer 111 may be disposed on the thin film transistor TFT, the first source/drain metal pattern 137, and the gate driver 300. The protective layer 111 may be disposed to cover the thin film transistor TFT, the first source/drain metal pattern 137, and the gate driver 300. The protective layer 111 may be formed as a single-layer of silicon nitride (SiNx) or silicon oxide (SiOx) or a multi-layer of silicon nitride (SiNx) and silicon oxide (SiOx). In the display area AA, a contact hole for exposing the drain electrode 137D of the thin film transistor TFT may be formed in the protective layer 111. In the non-display area NA, a contact hole for exposing the first source/drain metal pattern 137 may be formed in the protective layer 111.

The first intermediate layer 113 is an insulating layer which protects the thin film transistor TFT, the gate driver 300, and a plurality of lines or electrodes and diminishes a step on the base layer 101 to allow a surface on the base layer 101 to have a uniform height.

The first intermediate layer 113 may be disposed in both the display area AA and the non-display area NA. In the display area AA and the non-display area NA, the first intermediate layer 113 may be disposed on the protective layer 111 to overlap the thin film transistor TFT of the display area AA, the gate driver 300 of the non-display area NA, and the like. For example, as shown in FIGS. 3 and 4, the first intermediate layer 113 may be disposed in areas in which the gate driver 300 is positioned in the display area AA and the non-display area NA. In an area in which the first source/drain metal pattern 137 is positioned, a contact hole exposing the first source/drain metal pattern 137 may be formed by partially removing the first intermediate layer 113.

The first intermediate layer 113 may be made of one selected from among an acrylic-based resin, an epoxy resin, a phenolic resin, a polyamide-based resin, a PI-based resin, an unsaturated polyester-based resin, a polyphenylene-based resin, a polyphenylene sulfide-based resin, BCB, and a photoresist, but the present disclosure is not limited thereto.

As the first intermediate layer 113 is formed to be thinner, the first intermediate layer 113 becomes more advantageous for a process. However, the first intermediate layer 113 may have a thickness value ranging from at least 1 μm to 5 μm so as to maintain an appropriate interval between the first source/drain metal pattern 137 and the second source/drain metal pattern 139 and fill an indented portion of the first source/drain metal pattern 137.

The first intermediate layer 113 may be disposed to cover the thin film transistor TFT and the gate driver 300. In the display area AA, a contact hole for exposing the drain electrode 137D may be formed in the first intermediate layer 113. In the non-display area NA, the first intermediate layer 113 may include a contact hole for exposing the second source/drain metal pattern 139 together with the protective layer 111 disposed on the first source/drain metal pattern 137. The first intermediate layer 113 may be an organic material layer which protects the thin film transistor TFT and the gate driver 300 and diminishes a step on the base layer 101 to allow a surface on the base layer 101 to have a uniform height. For example, the first intermediate layer 113 may be made of an organic material, such as an acryl resin, an epoxy resin, a phenolic resin, a polyamide resin, or a PI resin, but the present disclosure is not limited thereto.

In the display area AA of the base layer 101, a connection electrode 139C (of FIG. 3) made of the same material as the second source/drain metal pattern 139 may be disposed on the first intermediate layer 113. The connection electrode 139C may be connected to the drain electrode 137D of the thin film transistor TFT through the contact holes of the first intermediate layer 113 and the protective layer 111 exposing the drain electrode 137D. The connection electrode 139C may serve to electrically connect the thin film transistor TFT and the light-emitting element 140. For example, the connection electrode 139C may serve to electrically connect the drain electrode 137D of the thin film transistor TFT and the first driving electrode 143 of the light-emitting element 140. The connection electrode 139C may be formed as a single-layer or a multi-layer made of one selected from among molybdenum (Mo), copper (Cu), titanium (Ti), aluminum (Al), chromium (Cr), gold (Au), nickel (Ni), or neodymium (Nd), or an alloy thereof, but the present disclosure is not limited thereto. The connection electrode 139C may be made of the same material as the source electrode 137S and the drain electrode 137D of the thin film transistor TFT.

In the non-display area NA of the base layer 101, the second source/drain metal pattern 139 may be disposed on the first intermediate layer 113. The second source/drain metal pattern 139 may be connected to the first source/drain metal pattern 137 through the contact holes of the first intermediate layer 113 and the protective layer 111 exposing the first source/drain metal pattern 137. The second source/drain metal pattern 139 may be formed as a single-layer or a multi-layer made of one selected from among molybdenum (Mo), copper Cu), titanium (Ti), aluminum (Al), chromium (Cr), gold (Au), nickel (Ni), or neodymium (Nd), or an alloy thereof. The second source/drain metal pattern 139 may be formed coplanar with the connection electrode 139C or the source electrode 137S and the drain electrode 137D of the thin film transistor TFT and may be made of the same material as the connection electrode 139C or the source electrode 137S and the drain electrode 137D, but the present disclosure is not limited thereto.

A plurality of contact holes through which the second source/drain metal pattern 139 passes may be formed in the first intermediate layer 113 and the protective layer 111 disposed under the second source/drain metal pattern 139, and the second source/drain metal pattern 139 may be electrically connected to the first source/drain metal pattern 137 through the contact holes.

Since the first source/drain metal pattern 137 and the second source/drain metal pattern 139 used as signal lines in the non-display area NA are electrically connected to each other, resistance may be lowered as compared to a case where the first source/drain metal pattern 137 or the second source/drain metal pattern 139 is formed as a separate line, thereby improving image quality.

In the display area AA of the base layer 101, the second intermediate layer 115 may be disposed on the connection electrode 139C and the first intermediate layer 113. For example, the second intermediate layer 115 may be disposed on the first intermediate layer 113 to cover the connection electrode 139C. As shown in FIGS. 3 and 4, contact holes for exposing the connection electrode 139C may be formed in the second intermediate layer 115. The second intermediate layer 115 may be an organic material layer that further diminishes a step of a structure thereunder due to the connection electrode 139C on the first intermediate layer 113 and additionally protects the structure thereunder. For example, the second intermediate layer 115 may be made of at least one selected from among organic materials such as an acrylic resin, an epoxy resin, a phenolic resin, a polyamide resin, and a PI resin, but the present disclosure is not limited thereto. The second intermediate layer 115 may be made of the same material as the first intermediate layer 113, but the present disclosure is not limited thereto.

In the non-display area NA of the base layer 101, the second intermediate layer 115 may be disposed to cover the second source/drain metal pattern 139. As shown in FIGS. 3 and 4, the second intermediate layer 115 may be formed to be in contact with the first intermediate layer 113 through an open portion of the second source/drain metal pattern 139. Since the first intermediate layer 113 and the second intermediate layer 115 are in contact with each other in the open portion of the second source/drain metal pattern 139, adhesive strength may be improved, thereby reducing defects due to delamination of the second source/drain metal pattern 139.

In the display device 1000 according to the embodiment of the present disclosure, the first intermediate layer 113 and the second intermediate layer 115 may be formed in the display area AA as insulating layers which diminish a step generated on an upper layer of the thin film transistor TFT to allow a surface on the base layer 101 to have a uniform height. Accordingly, it is possible to provide an additional space in which various lines used in the display area AA of the display device 1000 may be disposed.

For example, when compared to a case where one intermediate layer is used, an additional space in which a line may be disposed may be provided in a space between the first intermediate layer 113 and the second intermediate layer 115, that is, on an upper surface of the first intermediate layer 113. Accordingly, in the display device 1000 according to the embodiment of the present disclosure, a degree of freedom in design for a line arrangement may be increased. As a result, it is possible to provide the display device 1000 having higher resolution, and it is possible to solve a problem of luminance uniformity that may occur due to high resistance of lines disposed in the display area AA of the display device 1000.

Since the first intermediate layer 113 and the second intermediate layer 115 are made of an organic material, the first intermediate layer 113 and the second intermediate layer 115 may be vulnerable to external moisture. To prevent this, in the second area of the non-display area NA, the first intermediate layer 113 and the second intermediate layer 115 may be partially removed and thus may be formed to be disconnected by the lower connection line 143c and the second driving electrode 149.

The first driving electrode 143 of the light-emitting element 140 may be disposed on the second intermediate layer 115. The first driving electrode 143 may be electrically connected to the connection electrode 139C through the contact hole formed in the second intermediate layer 115.

Accordingly, the first driving electrode 143 may be connected to the connection electrode 139C through the contact hole formed in the second intermediate layer 115 to be electrically connected to the thin film transistor TFT.

The first driving electrode 143 may be formed in a multi-layered structure including a transparent conductive film and an opaque conductive film having high reflection efficiency. The transparent conductive film may be made of a material having a relatively large work function value such as indium-tin-oxide (ITO) or IZO. The opaque conductive film may be formed in a single-layered or multi-layered structure including at least one selected from among Al, Ag, Cu, Pb, Mo, and Ti, or an alloy thereof. For example, the first driving electrode 143 may be formed in a structure in which a transparent conductive film, an opaque conductive film, and a transparent conductive film are sequentially stacked. However, the present disclosure is not limited thereto, and the first driving electrode 143 may be formed in a structure in which a transparent conductive film and an opaque conductive film are sequentially stacked.

The display device 1000 according to the embodiment of the present disclosure may be a top emission-type display device 1000 or a bottom emission-type display device 1000. Accordingly, the first driving electrode 143 disposed on the second intermediate layer 115 may be an anode, and the first driving electrode 143 may be a cathode.

The bank layer 117 is a structure for dividing the subpixels adjacent to each other in the display area AA and may define the plurality of subpixels. The bank layer 117 may be made of an organic material. The bank layer 117 may be disposed on the first driving electrode 143 and the second intermediate layer 115.

In the display area AA, an opening for exposing the first driving electrode 143 may be formed in the bank layer 117. The bank layer 117 may also be referred to as a pixel definition film because the bank layer 117 may define the emission part of the display device 1000. The bank layer 117 may be disposed to cover both ends of the first driving electrode 143.

Spacers may be further disposed on the bank layer 117 in the fourth area of the non-display area NA in which the dam DAM is formed. In the third area of the non-display area NA, a portion of the bank layer 117 may be removed from the bank layer 117 to form the dam DAM of the fourth area.

The bank layer 117 and the spacer may be made of the same material. The bank layer 117 and the spacer may be made of an organic material. For example, the bank layer 117 and the spacer may be made of a PI-based, acrylic-based, or BCB-based resin, but the present disclosure is not limited thereto.

The light-emitting element 140 including the light-emitting layer 147 may be further disposed on the second intermediate layer 115 and the bank layer 117. FIG. 3 illustrates that the light-emitting layer 147 is patterned for each subpixel, but the present disclosure is not limited thereto. The light-emitting layer 147 may be a common layer formed in common in the plurality of subpixels. On the first driving electrode 143, the light-emitting layer 147 may include the hole transport layer, the hole blocking layer, the hole injection layer, the organic emission layer, the electron injection layer, the electron blocking layer, the electron transport layer, and the like which may be formed to be sequentially or reversely stacked according to the emission direction. In addition, the light-emitting layer 147 may include the first and second emission stacks opposite to each other with the charge generation layer interposed therebetween. In this case, an emission layer of one of the first and second emission stacks may generate blue light, and an emission layer of the other of the first and second emission stacks may generate yellow-green light, thereby generating white light through the first and second emission stacks. The white light generated by the light-emitting layer 147 may be incident on the color filter positioned on the light-emitting layer 147 to implement a color image. In addition, each light-emitting layer 147 may generate color light corresponding to each subpixel SP without a separate color filter, thereby implementing a color image. For example, the light-emitting layer 147 of the subpixel SP having a red color (R) may generate red light, the light-emitting layer 147 of the subpixel SP having a green color (G) may generate green light, and the light-emitting layer 147 of the subpixel SP having a blue color (B) may generate blue light.

The second driving electrode 149 may be further disposed on the light-emitting layer 147. The second driving electrode 149 may be disposed on the light-emitting layer 147 to be opposite to the first driving electrode 143 with the light-emitting layer 147 interposed therebetween.

The display device 1000 according to the embodiment of the present disclosure may be the top emission-type display device 1000 or the bottom emission-type display device 1000. Accordingly, the second driving electrode 149 may be a cathode, and the first driving electrode 143 may be an anode.

In the display area AA of the base layer 101, the encapsulation layer 150 may be disposed on the light-emitting element 140. For example, the encapsulation layer 150 that suppresses moisture permeation may be further disposed on the second driving electrode 149.

The encapsulation layer 150 reduces the permeation of external oxygen or moisture in order to prevent oxidation of a light-emitting material and an electrode material. When an organic light-emitting element is exposed to moisture or oxygen, a pixel shrinkage phenomenon in which an emission area is reduced may occur, or dark spots may occur in the emission area. The encapsulation layer 150 may be formed as an inorganic film made of glass, a metal, aluminum oxide (AlOx), or a silicon (Si)-based material or may have a structure in which an organic film and an inorganic film are alternately stacked. The inorganic film serves to block the permeation of moisture or oxygen, and the organic film serves to make a surface of the inorganic film have a uniform height. When the encapsulation layer is formed as a multi-layered thin film layer, the movement path of moisture or oxygen becomes longer and more complicated as compared with the case of a single layer, which makes it difficult for moisture/oxygen to permeate into the organic light-emitting element.

In the display device 1000 according to the embodiment of the present disclosure, the encapsulation layer 150 may include a first encapsulation layer 151, a second encapsulation layer 153, and a third encapsulation layer 155. The first encapsulation layer 151 of the encapsulation layer 150 may be disposed on the second driving electrode 149. The second encapsulation layer 153 may be disposed on the first encapsulation layer 151. In addition, the third encapsulation layer 155 may be disposed on the second encapsulation layer 153. The first encapsulation layer 151 and the third encapsulation layer 155 of the encapsulation layer 150 may be made of an inorganic material such as silicon nitride (SiNx) or silicon oxide (SiOx). The second encapsulation layer 153 of the encapsulation layer 150 may be made of at least one selected from organic materials such as an acrylic resin, an epoxy resin, a phenolic resin, a polyamide resin, and a PI resin, but the present disclosure is not limited thereto.

The edge of the bank etch layer 141 disposed in the display area AA is disposed inside the edge of the lower end portion of the bank layer 117 as compared with the edge of the bank etch layer 141 disposed in the non-display area NA. In the display device of the present disclosure, the bank etch layer 141, which protrudes inward toward the lower end portion of the bank layer 117, is further provided under the bank layer 117, and thus, the hole injection layer 144 formed in contact with the first driving electrode 143 is separated into a portion formed on the first driving electrode 143 and a portion formed on the bank layer 117 due to a shape of the bank etch layer, thereby allowing the hole injection layer 144 to be separated for each subpixel SP. The hole injection layer 144 may be separated by forming the bank etch layer 141 inside the edge of the bank layer 117 and forming the bank etch layer 141 so as to have a thickness greater than a target thickness of the hole injection layer 144.

By separating a material having high conductivity of the hole injection layer 144 for each subpixel SP, the common formation of the hole injection layer 144, which causes a leakage current, is possible without changing a deposition mask. That is, a leakage current is reduced to reduce defects in which an adjacent subpixel is turned on and driven in a low luminance state, thereby improving visibility.

In addition, a driving voltage can be lowered by separating a layer, which causes a leakage current, for each subpixel SP in the display device, and the light-emitting layer 147 driven at a low voltage can be applied.

Even when the concentration of a p-type dopant is increased, there is no problem of a side leakage current, the element characteristics can be improved, and the lifetime can be improved. In particular, although a threshold voltage is low, the p-type dopant can be applied as materials of a hole transport layer, a hole transport auxiliary layer, or a light-emitting layer, thereby significantly improving the lifetime.

In addition, the first driving electrode 143 is cleaned before and after the bank etch layer 141 is formed, thereby improving the bonding characteristics between the hole injection layers 144 having an interface with the first driving electrode 143, reducing point defects, and improving the lifetime.

A display device according to an embodiment of the present disclosure may be described as follows.

The display device according to the embodiment of the present disclosure includes a substrate having a display area and a non-display area, a lower connection line disposed in the non-display area, a bank layer disposed on the lower connection line and having an undercut structure at an edge of a lower end portion thereof, a bank etch layer disposed between the lower connection line and the bank layer and having an edge inside the edge of the lower end portion of the bank layer, and a second driving electrode disposed on the bank layer and electrically connected to the lower connection line at least once. A plurality of bank holes may be formed in the bank layer.

In the display device according to the embodiment of the present disclosure, the second driving electrode may be connected to the lower connection line through the bank hole, and the second driving electrode may be disposed to be spaced apart from the bank etch layer.

In the display device according to the embodiment of the present disclosure, the bank layer may include a bank open portion in an emission part of the display area, and the bank holes may be disposed more densely as compared with the bank open portion.

In the display device according to the embodiment of the present disclosure, the bank hole may be formed to be ⅓ to ⅕ smaller than the bank open portion.

In the display device according to the embodiment of the present disclosure, an edge of the bank etch layer disposed in the display area may be disposed inside the edge of the lower end portion of the bank layer as compared with an edge of the bank etch layer disposed in the non-display area.

In the display device according to the embodiment of the present disclosure, the bank etch layer may be formed as an inorganic insulating film.

In the display device according to the embodiment of the present disclosure, the inorganic insulating film may include at least one selected from among silicon nitride, silicon oxide, and silicon oxynitride.

The display device according to the embodiment of the present disclosure may further include a plurality of subpixels disposed in the display area, a first driving electrode provided for each subpixel and made of the same material as the lower connection line, and a hole injection layer disposed on the first driving electrode and the bank layer. The hole injection layer may be divided and disposed at the edge of the bank layer.

In the display device according to the embodiment of the present disclosure, the hole injection layer may be disposed to be spaced apart from the first driving electrode.

In the display device according to the embodiment of the present disclosure, a thickness of the bank etch layer may be greater than or equal to a thickness of the hole injection layer.

A display device according to an embodiment of the present disclosure includes a substrate which has a display area including a plurality of subpixels and a non-display area outside the display area, a first driving electrode provided for each subpixel, a lower connection line made of the same material as the first driving electrode and disposed in the non-display area, a bank layer disposed on the first driving electrode and the lower connection line and having an undercut structure at an edge thereof adjacent to the lower connection line, a second driving electrode disposed on the bank layer, spaced apart from the first driving electrode, and electrically connected to the lower connection line at least once, a bank etch layer disposed such that an upper surface thereof is covered by the bank layer. The second driving electrode may be in contact with a side portion of the bank layer.

In the display device according to the embodiment of the present disclosure, the non-display area may include a first area in contact with the display area to transmit a signal of a gate driver to the display area in which a gate driver is disposed, a second area in which the gate driver is disposed, a third area and a fourth area in which a power supply line for supplying power to the second driving electrode is disposed, a fifth area in which an end of an encapsulation layer for preventing oxygen or moisture permeation is disposed, and a sixth area in which a crack detector is disposed.

In the display device according to the embodiment of the present disclosure, a plurality of bank holes may be disposed in the second area.

In the display device according to the embodiment of the present disclosure, a dam may be disposed on the power supply line in the fourth area.

In the display device according to the embodiment of the present disclosure, the dam may be formed by stacking first and second intermediate layers, the bank layer, and a spacer.

In the display device according to the embodiment of the present disclosure, the second area may be implemented such that the first and second intermediate layers are separated by the lower connection line and the second driving electrode to block moisture permeation.

In the display device according to the embodiment of the present disclosure, the second driving electrode may be disposed to extend to the second area and may be formed so as to not be disconnected in the bank hole.

In the display device according to the embodiment of the present disclosure, the second driving electrode may be connected to the lower connection line at least once through the bank hole and may be disposed to be spaced apart from the bank etch layer.

In the display device according to the embodiment of the present disclosure, an edge of the bank etch layer disposed in the display area may be disposed inside an edge of a lower end portion of the bank layer as compared with an edge of the bank etch layer disposed in the non-display area.

In the display device according to the embodiment of the present disclosure, the bank layer may include a bank open portion in an emission part of the display area, and the bank hole may be formed to be ⅓ to ⅕ smaller than the bank open portion.

According to the embodiments of the present disclosure, a bank etch layer is formed to induce the disconnection of a hole injection layer in a display area, thereby preventing driving due to a leakage current between adjacent subpixels.

In addition, the bank etch layer, which is formed by being deposited in an entire area of a substrate, can protect a lower connection line from being damaged when a bank layer is patterned through a photo process.

In a second area of a non-display area, one or more bank holes are formed in the bank layer and the bank etch layer to connect the lower connection line and a second driving electrode, thereby preventing a driving failure due to a short circuit of a second driving electrode formed on the bank layer.

It should be noted that effects of the present disclosure are not limited to those described above and other effects are included in the present disclosure.

The features, structures, effects, and the like described in the above-described examples of the present disclosure are included in at least one example of the present disclosure, and the present disclosure is not necessarily limited only to one example. Further, the features, structures, effects, and the like illustrated in at least one example may be combined or modified to other examples by those skilled in the art to which the present disclosure belongs. Therefore, contents related to the combination or the modification should be interpreted to be included in the scope of the present disclosure.

The present disclosure described above is not limited to the above-described embodiments and the accompanying drawings, and it will be apparent to those skilled in the art to which the present disclosure belongs that various substitutions, modifications, and variations can be made without departing from the technical spirit or scope of the present disclosure. Therefore, the scope of the present disclosure is represented by the claims to be described below, and it is to be interpreted that the meaning and scope of the claims and all the changes or modified forms derived from the equivalents thereof come within the scope of the present disclosure.

What is claimed is:

1. A display device, comprising:
    a substrate having a display area including a plurality of subpixels and a non-display area outside the display area;
    a thin film transistor in each of the plurality of subpixels, the thin film transistor including a gate electrode, a source electrode and a drain electrode;
    a first intermediate layer and a second intermediate layer sequentially disposed on the thin film transistor;
    a light-emitting element on the second intermediate layer, the light-emitting element connected to the thin film transistor and including a first driving electrode, an electroluminescent layer, and a second driving electrode;
    a lower connection line in the non-display area;
    a bank layer on the lower connection line;
    a bank etch layer between the lower connection line and the bank layer;
    a power supply line connected to the second driving electrode through the lower connection line, the power supply line having a same material as one of the gate electrode, the source electrode, and the drain electrode;
    at least two dams over the power supply line, each of the at least two dams including the first intermediate layer, the second intermediate layer, the bank layer and a spacer, and the first intermediate layer and the second intermediate layer of the at least two dams separated from the first intermediate layer and the second intermediate layer in the display area;
    a crack detector surrounding the at least two dams in the non-display area, the crack detector including a same material as one of the gate electrode, the source electrode, or the drain electrode; and
    an encapsulation layer on the light-emitting element, the encapsulation layer including a first encapsulation layer, a second encapsulation layer, and a third encapsulation layer, an end of the first encapsulation layer farther from the display area than an end of the second encapsulation layer, and the first encapsulation layer overlapping the crack detector,
    wherein the second intermediate layer of one of the at least two dams and the second intermediate layer of another of the at least two dams are separated from each other,
    wherein a first portion of the lower connection line is in contact with the second driving electrode of the light-emitting element and a second portion of the lower connection line is between the bank layer and the second intermediate layer of at least one of the at least two dams, and
    wherein each of the at least two dams further includes the lower connection line and the bank etch layer between the second intermediate layer and the bank layer.

2. The display device of claim 1, wherein the second driving electrode is spaced apart from the bank etch layer.

3. The display device of claim 1, wherein the bank layer includes a plurality of bank holes in the non-display area.

4. The display device of claim 3, wherein the plurality of bank holes comprise a plurality of bank islands spaced apart from each other by the bank layer.

5. The display device of claim 3, wherein the second driving electrode is connected to the lower connection line through the plurality of bank holes.

6. The display device of claim 3, wherein the bank layer includes a bank open portion in an emission part of the display area, and the plurality of bank holes are more densely disposed compared with the bank open portion.

7. The display device of claim 1, wherein a semiconductor layer of the thin film transistor includes one of an amorphous semiconductor material, a polycrystalline semiconductor material, or an oxide semiconductor material.

8. The display device of claim 1, further comprising:
a source/drain metal pattern between the first intermediate layer and the second intermediate layer,
wherein the source/drain metal pattern on the first intermediate layer is connected to the power supply line, and the lower connection line on the second intermediate layer is connected to the source/drain metal pattern.

9. The display device of claim 1, further comprising:
a hole injection layer on the first driving electrode and the bank layer,
wherein the bank layer includes a bank open portion in the display area and a plurality of bank holes in the non-display area, and
wherein a size of the bank open portion is greater than a size of each of the plurality of bank holes such that the hole injection layer on the first driving electrode is divided from the hole injection layer on the bank layer and the second driving electrode on the lower connection line is connected to the second driving electrode on the bank layer.

10. The display device of claim 1, wherein the bank layer and the spacer of one of the at least two dams are disposed on the power supply line, and the bank layer and the spacer of another of the at least two dams are disposed on the power supply line.

11. The display device of claim 1, wherein the power supply line extends past ends of the bank layer and the spacer of the one of the at least two dams and overlaps the bank layer and the spacer of the one of the at least two dams in a cross-section view of the display device, and the power supply line extends past ends of the bank layer and the spacer of the other of the at least two dams and overlaps the bank layer and the spacer of the other of the at least two dams in the cross-section view.

12. The display device of claim 1, wherein the bank layer and the bank etch layer include a plurality of bank holes in the non-display area and a bank open portion in an emission part of the display area.

13. A display device, comprising:
a substrate having a display area including a plurality of subpixels and a non-display area outside the display area;
a thin film transistor in each of the plurality of subpixels, the thin film transistor including a gate electrode, a source electrode, and a drain electrode;
a first intermediate layer and a second intermediate layer sequentially disposed on the thin film transistor;
a light-emitting element on the second intermediate layer, the light-emitting element connected to the thin film transistor and including a first driving electrode, an electroluminescent layer, and a second driving electrode;
a lower connection line in the non-display area;
a bank layer on the lower connection line, the bank layer a plurality of bank holes in the non-display area;
a bank etch layer between the lower connection line and the bank layer;
a power supply line connected to the second driving electrode through the lower connection line, the power supply line having a same material as one of the gate electrode, the source electrode, or the drain electrode;
at least two dams over the power supply line, each of the at least two dams including the first intermediate layer, the second intermediate layer, the bank layer and a spacer, and the first intermediate layer and the second intermediate layer of the at least two dams separated from the first intermediate layer and the second intermediate layer in the display area;
a crack detector surrounding the at least two dams in the non-display area, the crack detector including a same material as one of the gate electrode, the source electrode, or the drain electrode; and
an encapsulation layer on the light-emitting element, the encapsulation layer including a first encapsulation layer, a second encapsulation layer, and a third encapsulation layer, and the encapsulation layer overlapping the crack detector,
wherein the second intermediate layer of one of the at least two dams and the second intermediate layer of another of the at least two dams are separated from each other,
wherein a first portion of the lower connection line is in contact with the second driving electrode of the light-emitting element and a second portion of the lower connection line is between the bank layer and the second intermediate layer of at least one of the at least two dams,
wherein each of the at least two dams further includes the lower connection line and the bank etch layer between the second intermediate layer and the bank layer.

14. The display device of claim 13, wherein the second driving electrode is spaced apart from the bank etch layer.

15. The display device of claim 13, wherein the plurality of bank holes comprise a plurality of bank islands spaced apart from each other by the bank layer.

16. The display device of claim 13, wherein the second driving electrode is connected to the lower connection line through the plurality of bank holes.

17. The display device of claim 13, wherein the bank layer includes a bank open portion in an emission part of the display area, and the plurality of bank holes are more densely disposed compared with the bank open portion.

18. The display device of claim 13, wherein a semiconductor layer of the thin film transistor includes one of an amorphous semiconductor material, a polycrystalline semiconductor material, or an oxide semiconductor material.

19. The display device of claim 13, further comprising:
a source/drain metal pattern between the first intermediate layer and the second intermediate layer,
wherein the source/drain metal pattern on the first intermediate layer is connected to the power supply line, and the lower connection line on the second intermediate layer is connected to the source/drain metal pattern.

20. The display device of claim 13, further comprising:
a hole injection layer on the first driving electrode and the bank layer,
wherein the bank layer includes a bank open portion in the display area and a plurality of bank holes in the non-display area, and
wherein a size of the bank open portion is greater than a size of each of the plurality of bank holes such that the hole injection layer on the first driving electrode is divided from the hole injection layer on the bank layer and the second driving electrode on the lower connection line is connected to the second driving electrode on the bank layer.

21. A display device, comprising:
- a substrate having a display area including a plurality of subpixels and a non-display area outside the display area;
- a thin film transistor in each of the plurality of subpixels, the thin film transistor including a gate electrode, a source electrode, and a drain electrode;
- a first intermediate layer and a second intermediate layer sequentially disposed on the thin film transistor;
- a light-emitting element on the second intermediate layer, the light-emitting element connected to the thin film transistor and including a first driving electrode, an electroluminescent layer, and a second driving electrode;
- a lower connection line in the non-display area;
- a bank layer on the lower connection line, the bank layer including a plurality of bank holes in the non-display area;
- a bank etch layer between the lower connection line and the bank layer;
- a power supply line connected to the second driving electrode through the lower connection line, the power supply line having a same material as one of the gate electrode, the source electrode, or the drain electrode;
- at least two dams over the power supply line, each of the at least two dams including the first intermediate layer, the second intermediate layer, the bank layer and a spacer, and the first intermediate layer and the second intermediate layer of the at least two dams separated from the first intermediate layer and the second intermediate layer in the display area;
- a crack detector at an outmost portion of the non-display area and surrounding the at least two dams and the power supply line, the crack detector including a same material as one of the gate electrode, the source electrode, or the drain electrode; and
- an encapsulation layer on the light-emitting element, the encapsulation layer including a first encapsulation layer, a second encapsulation layer, and a third encapsulation layer,
- wherein the second intermediate layer of one of the at least two dams and the second intermediate layer of another of the at least two dams are separated from each other,
- wherein a first portion of the lower connection line is in contact with the second driving electrode of the light-emitting element and a second portion of the lower connection line is between the bank layer and the second intermediate layer of at least one of the at least two dams, and
- wherein each of the at least two dams further includes the lower connection line and the bank etch layer between the second intermediate layer and the bank layer.

22. The display device of claim 21, wherein the second driving electrode is spaced apart from the bank etch layer.

23. The display device of claim 21, wherein the plurality of bank holes comprise a plurality of bank islands spaced apart from each other by the bank layer.

* * * * *